(12) United States Patent
Kitamura

(10) Patent No.: US 9,565,754 B2
(45) Date of Patent: Feb. 7, 2017

(54) SOLDER-MOUNTED BOARD, PRODUCTION METHOD THEREFOR, AND SEMICONDUCTOR DEVICE

(71) Applicant: SAN-EI KAGAKU CO., LTD., Tokyo (JP)

(72) Inventor: Kazunori Kitamura, Saitama (JP)

(73) Assignee: SAN-EI KAGAKU CO., LTD., Tokyo (JP)

( * ) Notice: Subject to any disclaimer, the term of this patent is extended or adjusted under 35 U.S.C. 154(b) by 815 days.

(21) Appl. No.: 13/712,385

(22) Filed: Dec. 12, 2012

(65) Prior Publication Data

US 2013/0264105 A1   Oct. 10, 2013

(30) Foreign Application Priority Data

Apr. 4, 2012 (JP) ................ 2012-085951
Sep. 13, 2012 (JP) ................ 2012-201494

(51) Int. Cl.
*H05K 1/16* (2006.01)
*H05K 1/02* (2006.01)
(Continued)

(52) U.S. Cl.
CPC ....... *H05K 1/0296* (2013.01); *H01L 23/49894* (2013.01); *H01L 24/81* (2013.01); *H05K 3/00* (2013.01); *H05K 3/3436* (2013.01); *H05K 3/3452* (2013.01); *H01L 2224/131* (2013.01); *H01L 2224/16237* (2013.01); *H01L 2224/293* (2013.01); *H01L 2224/2929* (2013.01); *H01L 2224/73204* (2013.01); *H01L 2224/81191* (2013.01); *H01L 2224/81193* (2013.01); *H01L 2224/81815* (2013.01); *H01L 2224/83104* (2013.01); *H01L 2224/83192* (2013.01); *H01L 2924/12042* (2013.01); *H05K 1/181* (2013.01); *H05K 3/305* (2013.01); *H05K 3/3442* (2013.01);
(Continued)

(58) Field of Classification Search
CPC ...... H05K 1/0296; H05K 3/00; H05K 3/3436; H05K 3/3452; H05K 1/181; H01L 24/81
USPC ......... 174/260, 250, 251, 255–259, 261–263
See application file for complete search history.

(56) References Cited

FOREIGN PATENT DOCUMENTS

JP     04-280443     10/1992
JP     05-291735     11/1993
(Continued)

OTHER PUBLICATIONS

Machine Translation of Fujio, Japanese Patent Publication No. 2013-115145 (Oct. 6, 2013).*
(Continued)

*Primary Examiner* — Tremesha S Willis
(74) *Attorney, Agent, or Firm* — Young & Thompson

(57) ABSTRACT

The present invention provides a solder-mounted board which realizes reliable mounting of a component thereon; a method for producing the board; and a semiconductor device. The solder-mounted board includes a substrate; a wiring layer; a solder pad for mounting a component by the mediation of the solder; and an insulating layer which covers the wiring layer such that at least the solder pad is exposed, the wiring layer, the solder pad, and the insulating layer being provided on at least one surface of the substrate, wherein the insulating layer is formed of a first insulating layer provided on the substrate and the wiring layer, and a second insulating layer provided on at least a portion of the first insulating layer.

9 Claims, 14 Drawing Sheets

(51) Int. Cl.
*H05K 3/00* (2006.01)
*H05K 3/34* (2006.01)
*H01L 23/498* (2006.01)
*H01L 23/00* (2006.01)
*H05K 1/18* (2006.01)
*H05K 3/30* (2006.01)

(52) U.S. Cl.
CPC ....... *H05K 3/3484* (2013.01); *H05K 2201/099* (2013.01); *H05K 2201/0989* (2013.01); *H05K 2201/10674* (2013.01); *H05K 2201/10977* (2013.01); *H05K 2203/0588* (2013.01); *Y02P 70/613* (2015.11); *Y10T 156/10* (2015.01)

(56) References Cited

FOREIGN PATENT DOCUMENTS

| | | |
|---|---|---|
| JP | 08-340169 | 12/1996 |
| JP | 09-232741 | 9/1997 |
| JP | 3390664 | 1/2003 |
| JP | 3420076 | 4/2003 |
| JP | 2004-327743 | 11/2004 |
| JP | 2013-115145 | 6/2013 |

OTHER PUBLICATIONS

Japanese Office Action dated Jan. 29, 2014 in corresponding Japanese Patent Application No. 2012-201494.

\* cited by examiner

Prior Art

Prior Art

Prior Art

Prior Art

Prior Art

Prior Art

SOLDER-MOUNTED BOARD, PRODUCTION METHOD THEREFOR, AND SEMICONDUCTOR DEVICE

The entire disclosure of Japanese Patent Applications No. 2012-085951 filed on Apr. 4, 2012 and No. 2012-201494 filed on Sep. 13, 2012 is expressly incorporated by reference herein.

BACKGROUND OF THE INVENTION

Field of the Invention

The present invention relates to a solder-mounted board on which a component is mounted by means of the solder; to a method for producing the board; and to a semiconductor device.

Background Art

Soldering is widely used for mounting, on a board, a component employed for, for example, a semiconductor device such as an LSI or WLP (wafer level package).

Such a soldering process will now be described with reference to drawings.

FIG. 6 shows the case of employing a mounting board 100 including a substrate 101; wiring layers 102 and mounting pads 103 which are provided on the substrate 101; and a solder resist 104 provided so as to cover the entire wiring layers 102 and a portion of the mounting pads 103 (FIG. 6A). A cream solder 105 is applied to the mounting board 100 (FIG. 6B), and solder bumps 106 are formed through reflowing (FIG. 6C). Subsequently, a flux 107 is applied to the mounting board 100 (FIG. 6D), and then a component 110 is applied onto the solder bumps 106 (FIG. 6E), followed by reflowing, to thereby mount the component 110 on the mounting board 100 (FIG. 6F). Thereafter, the flux is removed through washing (FIG. 6G), and an underfill 108 is charged between the mounting board and the component (FIG. 6H).

FIG. 7 shows the case where a component is mounted directly on a mounting board without use of a cream solder. A mounting board 100 similar to that described above is provided (FIG. 7A), and a flux 107 is applied thereto (FIG. 7B). A component 110 is applied to (FIG. 7C) and mounted on the board through reflowing (FIG. 7D). Subsequently, the flux is removed through washing (FIG. 7E), and an underfill 108 is charged between the mounting board and the component (FIG. 7F).

FIG. 8 shows the case where a process is simplified by employing an adhesive containing a flux (see, for example, Japanese Patent Application Laid-Open (kokai) No. H04-280443). In this case, a mounting board 100 similar to that described above is provided (FIG. 8A), and a flux-containing adhesive layer 109 is formed on the board (FIG. 8B). Subsequently, a component 110 is applied to the adhesive layer 109 (FIG. 8C) and mounted through reflowing (FIG. 8D), followed by curing of the adhesive layer 109 (FIG. 8E). In this case, charging of an underfill is omitted.

With recent high-density mounting of components on a board, in such a soldering process, the connection pitch between the components and the board is reduced, and the aforementioned SMD design may cause various problems.

For example, the process shown in FIG. 6 may cause problems in that the pitch of openings in the solder resist is reduced, and thus the cream solder provided on the board falls off, resulting in mounting failure, and in that the solder flows upward during reflowing due to a high opening aspect ratio of the solder resist 104, resulting in poor mounting reliability. In addition, this process may cause a problem in terms of variation in size of solder bumps of each pad. Meanwhile, the process shown in FIG. 7 or 8 (i.e., the process employing no cream solder) may cause a problem in that the solder of the component 110 does not reach the mounting pads 103, resulting in connection failure, which problem is associated with the relationship between the size of solder bumps of the component 110 and the opening aspect ratio of the solder resist 104.

Problems associated with recent high-density mounting of components arise not only in the mounting process, but also in the aforementioned mounting board 100 itself.

In the case of high-density mounting of components on the mounting board 100, when the size of openings in the solder resist 104 is reduced, development of the solder resist 104 may become excessive or insufficient, and problems may arise in that, for example, the solder resist 104 itself is deformed, and cracking occurs in the solder resist 104 after mounting of the component 110. When the elastic modulus of the solder resist is reduced for solving such problems (e.g., cracking), migration is likely to occur between the wiring layers 102. In the case of a substrate having wiring layers on both surfaces thereof, due to the difference in area between the wiring layers provided on the top and bottom surfaces of the substrate, the amount of the solder resist 104 applied to the top-side wiring layer may differ from that of the solder resist 104 applied to the bottom-side wiring layer, resulting in a problem in that the substrate is likely to warp through curing and shrinkage.

Also, in association with high-density mounting of components on the mounting board 100, the underfill provided for reinforcing connection portions of the component 110 mounted on the board 100 may flow outside the component 110 due to the presence of a gap between the component and the board after connection, and the amount of the resin charged below the component 110 may become insufficient (i.e., some portions may fail to be charged with the resin), resulting in poor reliability. Particularly in the case of the process shown in FIG. 8 (i.e., the process in which the underfill resin is provided in advance), since resin easily flows outside the component, the problem of shortage of the resin below the component becomes even more significant.

In order to solve such a problem, there has been proposed a flip-chip mounting board in which a wide connection pad is provided, and wiring width is reduced, so as to reliably connect the connection pad to a component (see Japanese Patent No. 3420076). Since the board according to the invention disclosed in Japanese Patent No. 3420076 has this configuration, when solder powder is melted, molten solder gathers on the wide connection pad, and intended solder bumps are formed on the surface of the connection pad, whereby a component can be reliably connected to the connection (mounting) pad.

Meanwhile, there has been proposed a technique for preventing the aforementioned charging failure of an underfill, in which the opening of an insulating film is enlarged to the outside of the outline of a mounting component, and a wiring layer is provided in an inner region of the mounting component (see Japanese Patent No. 3390664).

However, this technique cannot be applied to the case where a connection portion is present not only at the periphery of the component, but also at the center thereof.

SUMMARY OF THE INVENTION

In view of the foregoing, an object of the present invention is to provide a solder-mounted board which realizes reliable mounting of a component thereon. Another object of the present invention is to provide a method for producing the board. Yet another object of the present invention is to provide a semiconductor device.

In a first mode of the present invention, there is provided a solder-mounted board comprising a substrate; a wiring layer; a solder pad for mounting a component by the mediation of the solder; and an insulating layer which covers the wiring layer such that at least the solder pad is exposed, the wiring layer, the solder pad, and the insulating layer being provided on at least one surface of the substrate, wherein the insulating layer is formed of a first insulating layer provided on the substrate and the wiring layer, and a second insulating layer provided on at least a portion of the first insulating layer.

A second mode of the present invention is drawn to a specific embodiment of the solder-mounted board according to the first mode, wherein at least a portion of the solder pad is exposed through an opening provided in the first insulating layer.

A third mode of the present invention is drawn to a specific embodiment of the solder-mounted board according to the first or second mode, wherein an opening is provided in the second insulating layer such that a component mounting region falls within the opening, the component mounting region including a plurality of solder pad portions exposed through openings provided in the first insulating layer.

A fourth mode of the present invention is drawn to a specific embodiment of the solder-mounted board according to any of the first to third modes, wherein at least a portion of the solder pad is exposed through an opening provided in a portion of the insulating layer at which the first insulating layer and the second insulating layer are stacked together.

A fifth mode of the present invention is drawn to a specific embodiment of the solder-mounted board according to any of the first to fourth modes, wherein the first insulating layer is formed of a thermosetting solder resist or a photocurable solder resist.

A sixth mode of the present invention is drawn to a specific embodiment of the solder-mounted board according to any of the first to fifth modes, wherein the second insulating layer is formed of a photocurable solder resist or a thermosetting solder resist.

In a seventh mode of the present invention, there is provided a semiconductor device comprising a solder-mounted board as recited in any of the first to sixth modes, and a component mounted on the board by the mediation of the solder.

In an eighth mode of the present invention, there is provided a method for producing a solder-mounted board comprising a substrate; a wiring layer; and a solder pad for mounting a component by the mediation of the solder, the wiring layer and the solder pad being provided on at least one surface of the substrate, and further comprising a first insulating layer provided on the solder pad, and a second insulating layer provided on at least a portion of the first insulating layer, which method comprises:

applying a first solder resist to a substrate having, on at least one surface thereof, a wiring layer and a solder pad;

forming a non-developable portion of the first solder resist at least in a first region, which region has only a first insulating layer;

applying a second solder resist to the first solder resist;

forming a non-developable portion of the first and second solder resists at least in a second region, which region has the first insulating layer and a second insulating layer; and removing, through development, the second solder resist, exclusive of the portion corresponding to the second region, and also the first solder resist, exclusive of the portions corresponding to the second region and the first region.

A ninth mode of the present invention is drawn to a specific embodiment of the method for producing a solder-mounted board according to the eighth mode, wherein formation of the non-developable portion in the second region of the first and second solder resists is carried out through light exposure in the second region of the first and second solder resists, or thermal treatment in all regions.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Embodiment 1

Figure 1A:
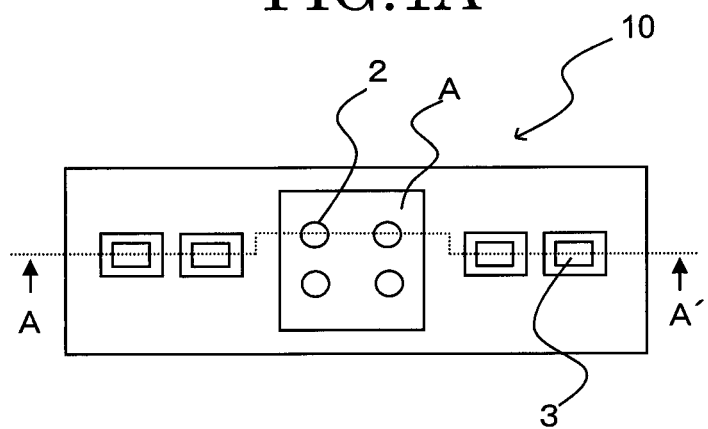
FIG. 1A is a plan view of a solder-mounted board according to Embodiment 1.
Figure 1B:
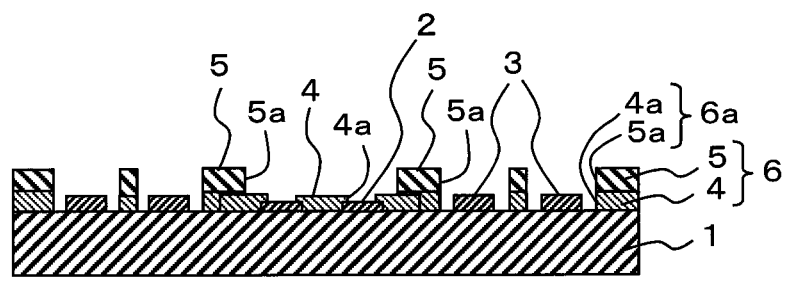
FIG. 1B is a cross-sectional view of the solder-mounted board according to Embodiment 1.

FIG. 1A is a top view (plan view) of an essential portion of a solder-mounted board according to Embodiment 1 of the present invention; and FIG. 1B is a cross-sectional view of FIG. 1A as taken along line A-A'.

As shown in FIGS. 1A and 1B, the solder-mounted board 10 according to the present embodiment includes a substrate main body 1 (e.g., a plastic substrate) whose at least one surface is formed of an insulating material; small-sized mounting pads 2 formed of copper or the like, and mounting pads 3 having a relatively large size, the mounting pads 2 and 3 being provided on one surface (hereinafter may be referred to as the "top surface") of the substrate main body 1; and a non-illustrated wiring layer which is continuous with these mounting pads. The mounting pads 2 are exposed through openings 4a of a first insulating layer 4. In the present embodiment, a component is mounted in a mounting region A (i.e., a region in which the four mounting pads 2 are arranged), and an opening 5a of a second insulating layer 5 is provided such that the mounting region A falls within the opening 5a. The second insulating layer 5 is provided on the first insulating layer 4. In the region exposed through the opening 5a, there are present a portion of the first insulating layer 4, and the mounting pads 2 exposed through the openings 4a of the first insulating layer 4. The mounting pads 2 are provided at a pitch of, for example, 200 μm or less. Each opening 4a has a size of 100 μm or less, preferably about 10 to about 80 μm.

The mounting pads 3 are exposed through openings 6a provided in a laminate 6 formed of the first insulating layer 4 and the second insulating layer 5, and each opening 6a is formed of an opening 4b of the first insulating layer 4 and an opening 5b of the second insulating layer 5. The mounting pads 3 are provided at a pitch greater than 200 μm (e.g., 200 to 1,000 μm), and each opening 6a has a size of 100 to 500 μm.

The thickness of the first insulating layer 4, which is provided on the wiring layer of the mounting pads 2, etc., is preferably 10 μm or less (e.g., 3 to 10 μm). The second insulating layer 5 has a thickness of, for example, 10 to 25 μm. As used herein, the "thickness" of the first insulating layer 4 or the second insulating layer 5 corresponds to the thickness after curing. The application thickness of the material for forming each insulating layer is determined in consideration of the thickness of the layer after curing.

In the mounting board 10, since the mounting pads 2 exposed through the small-sized openings 4a are surrounded by only the thin first insulating layer 4, a component can be readily mounted on the mounting pads 2 without use of a cream solder. Also, reliable mounting of a component on the mounting pads 2 may be achieved by applying, to the pads 2, a resin which functions as a flux and also serves an underfill after mounting of the component.

In the present embodiment, the mounting region A in which the four mounting pads 2 are provided is present within the opening 5a of the second insulating layer 5, and the mounting region A is surrounded by the second insulating layer 5 whose top surface is flush with that of the laminate 6 formed of the first insulating layer 4 and the second insulating layer 5. Therefore, outflow of the resin serving as an underfill can be prevented, and problems (e.g., charging failure of the underfill resin) can also be avoided.

The mounting pads 3, each having a relatively large size, are exposed through the openings 6a of the laminate 6 formed of the first insulating layer 4 and the second insulating layer 5, and can be secured to have a structure similar to that of conventional mounting pads.

Since the laminate 6—which has the openings 6a through which the mounting pads 3 are exposed—has a layered structure formed of the first insulating layer 4 and the second insulating layer 5, properties can be flexibly designed as compared with the case where a single-layer structure is employed, and problems (e.g., cracking of the insulating layers) can be avoided.

Each of the first insulating layer 4 and the second insulating layer 5 may be formed of a photocurable (photosensitive) solder resist or a thermosetting solder resist, which may be of a negative type or a positive type.

Preferably, for example, both the first insulating layer 4 and the second insulating layer 5 are formed from a photocurable solder resist through patterning by means of photolithography, from the viewpoint of achieving highly accurate patterning.

In contrast, when a thermosetting solder resist is applied to the substrate via a mask having a specific pattern, a patterned layer can be readily formed through thermal curing, as compared with the case where a photocurable solder resist is employed. However, a thermosetting solder resist may cause a problem in terms of positional accuracy. Therefore, preferably, a thermosetting solder resist is employed for forming the second insulating layer 5 particularly in the case where the layer does not have small-sized openings or a similar pattern. Needless to say, the first insulating layer 4 having the aforementioned small-sized openings 4a may be formed of a thermosetting solder resist. In this case, the openings 4a are preferably formed through post-processing by means of, for example, a laser.

A first characteristic feature of the mounting board of the present invention resides in that only the thin first insulating layer 4 having the openings 4a is provided for the small-sized mounting pads 2 which are arranged in high density. From this viewpoint, the first insulating layer 4 must be formed through highly accurate patterning, and thus is preferably formed of a photocurable solder resist. The first insulating layer 4 has a thickness of 3 to 10 μm, and a portion of the layer 4 formed on the mounting pads 2 has a thickness of 10 μm or less (preferably 3 to 6 μm). Therefore, a component having solder bumps (e.g., solder bumps having a size of 30 μm) can be readily mounted on the mounting pads without use of a cream solder. The mounting pads 2 may be provided with a resin which functions as a flux before mounting of such a component on the pads.

A second characteristic feature of the mounting board of the present invention resides in that the opening 5a (serving as a weir) of the second insulating layer 5 is formed such that the mounting region of the thin first insulating layer 4—in which a plurality of the openings 4a are formed to have a specific pattern—falls within the opening 5a. The inner circumferential surface of the opening 5a of the second insulating layer 5 serves as a weir for preventing flow of an underfill or a resin which functions as a flux to the outside of the mounting region. From this viewpoint, the opening 5a of the second insulating layer 5 may be required to have relatively high positional accuracy. Therefore, the second insulating layer 5 is preferably formed of a photocurable solder resist.

The mounting board of the present invention may have both the structure in the vicinity of the mounting pads 2 and the structure in the vicinity of the mounting pads 3, or may have either the structure in the vicinity of the mounting pads 2 or the structure in the vicinity of the mounting pads 3. The present invention encompasses all of these cases.

Next will be described, with reference to a mounting process, a semiconductor device including the mounting board of the present invention and a component mounted on the board.

Figure 2A:
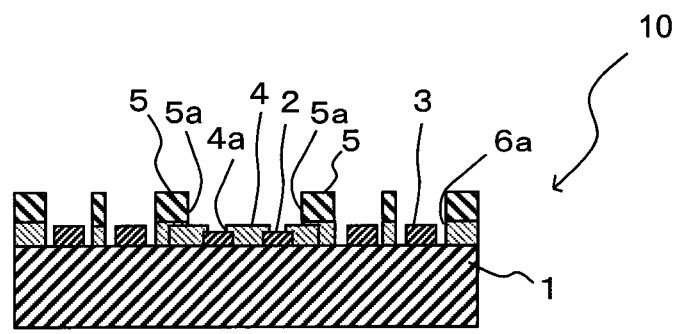
FIGS. 2A to 2E are cross-sectional sketches showing a method for producing a semiconductor device according to Embodiment 1.
Figure 2B:
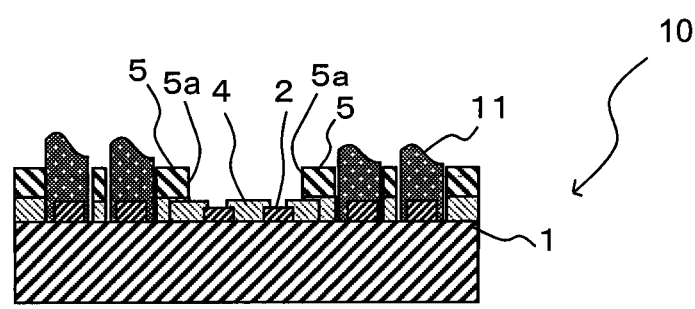
Figure 2C:
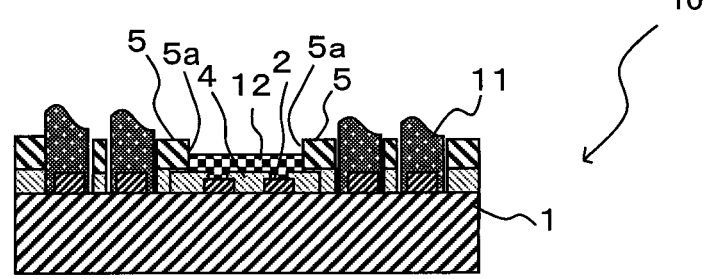
Figure 2D:
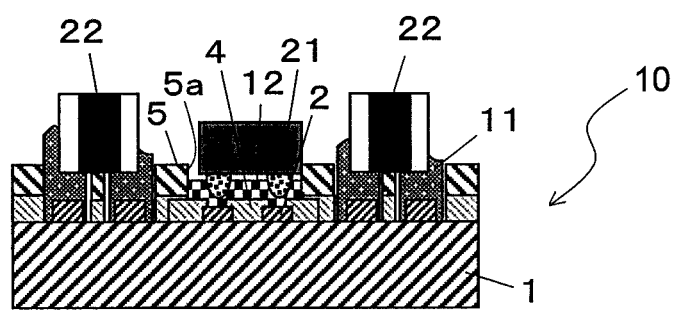
Figure 2E:
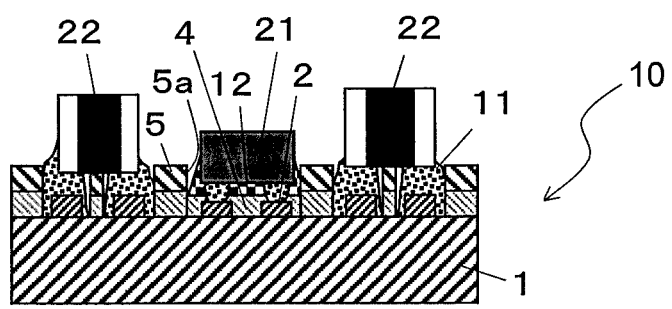

FIGS. 2A to 2E show an exemplary mounting process. In this process, a mounting board 10 as shown in FIG. 1 is provided (FIG. 2A), and a cream solder 11 is applied to openings 6a through which mounting pads 3 are exposed (FIG. 2B). Subsequently, a resin 12 which functions as a flux is applied to an opening 5a which includes openings 4a through which mounting pads 2 are exposed (FIG. 2C). Next, components 21 and 22 are applied to the board (FIG. 2D), and then mounted through reflowing. Thereafter, the resin below the component 21 is cured, to thereby produce a semiconductor device (FIG. 2E).

In this mounting process, the component 21 is mounted onto the mounting pads 2 by the mediation of the resin 12 which functions as a flux. Since the mounting pads 2 are exposed through the openings 4a of the relatively thin first insulating layer 4, connection failure does not occur. In addition, the resin 12 which functions as a flux remains in the opening 5a of the second insulating layer 5, and charging failure or a similar problem does not occur.

Next will be described one embodiment of the mounting board of the present invention with reference to a production process therefor.

Figure 3A:
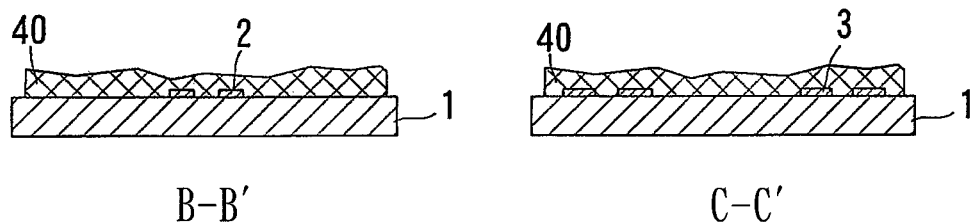
FIGS. 3A to 3H are cross-sectional sketches showing a method for producing the solder-mounted board according to Embodiment 1.
Figure 3B:
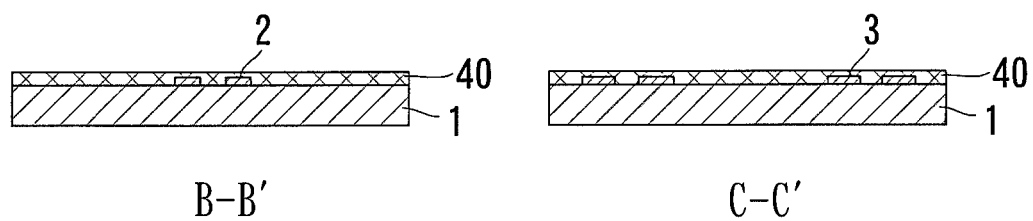
Figure 3C:
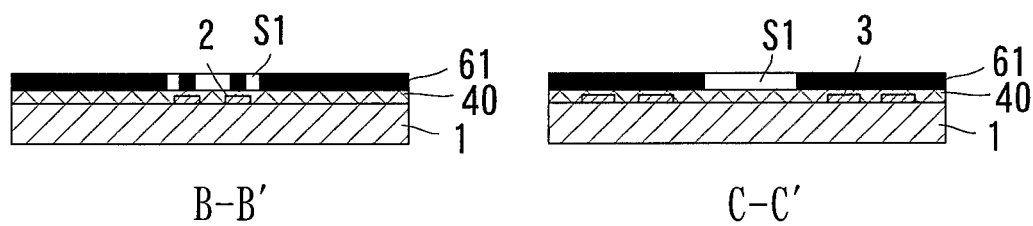
Figure 3D:
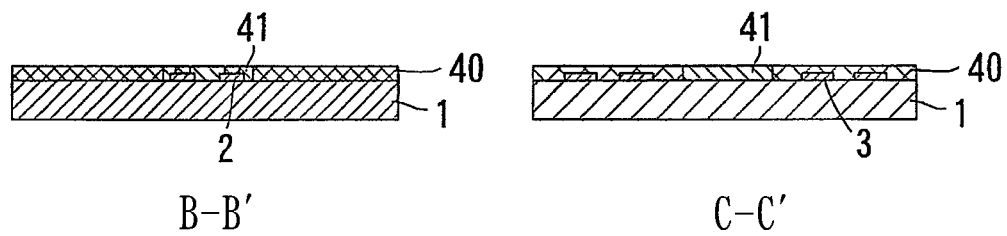
Figure 3E:
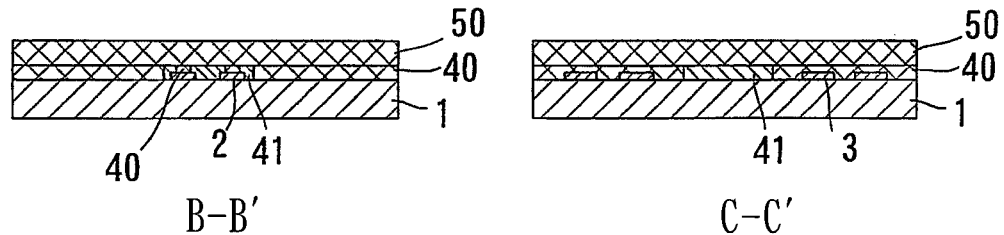
Figure 3F:
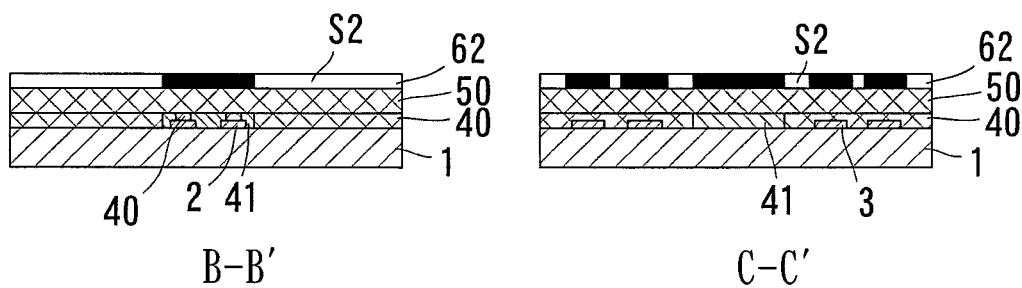
Figure 3G:
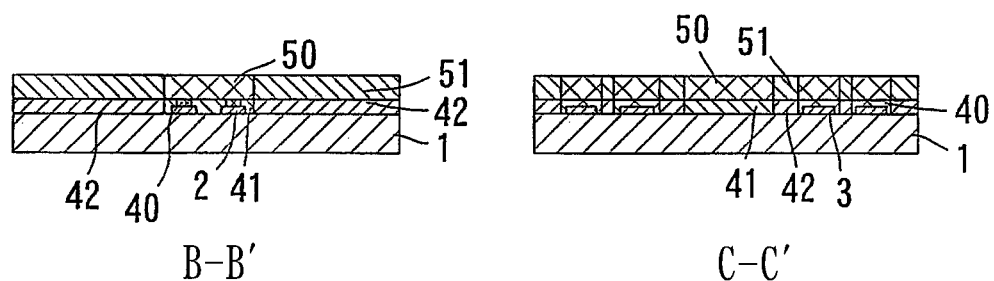
Figure 3H:
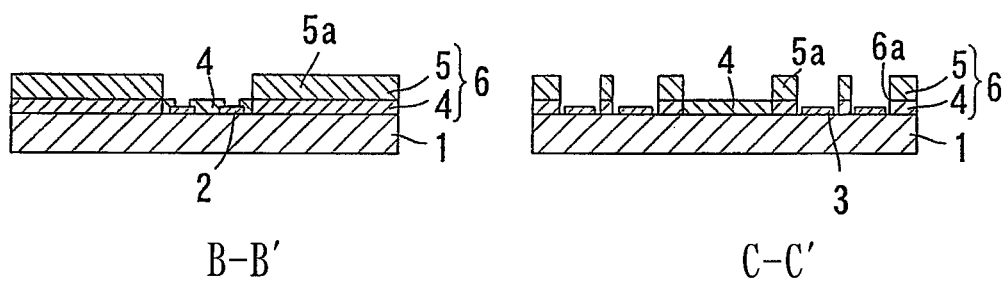
Figure 4:
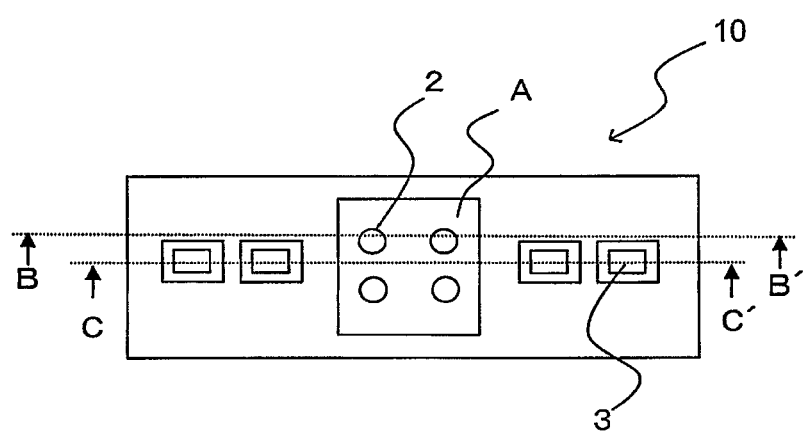
FIG. 4 is a plan view of the solder-mounted board according to Embodiment 1.

FIGS. 3A to 3H show a process for producing a mounting board according to one embodiment. Specifically, FIGS. 3A to 3H show cross-sections of a solder-mounted board taken along line B-B' or line C-C' shown in FIG. 4. As shown in FIG. 3A, a circuit including mounting pads 2 and 3 is formed on a plastic substrate 1 through patterning, and then a first solder resist 40 (negative-type photosensitive solder resist) is applied to the substrate 1. Subsequently, drying and planarization treatment are carried out (FIG. 3B), and then only a first region S1 in which only a first insulating layer is to be provided is exposed to light via a mask 61 (FIG. 3C), to thereby form a non-developable portion 41 (corresponding to the first region S1; i.e., light exposure region) in the first solder resist 40 (FIG. 3D). Next, a second solder resist 50 (negative-type photosensitive solder resist) is applied to the first solder resist 40, followed by drying (FIG. 3E). Then, a second region S2 in which both the first insulating layer and a second insulating layer are to be provided is exposed to light via a mask 62 (FIG. 3F), to thereby form a non-developable portion 51 of the second solder resist 50 and a non-developable portion 42 of the first solder resist 40 (FIG. 3G). Finally, the second solder resist 50 (exclusive of the non-developable portion 51) and the first solder resist 40 (exclusive of the non-developable portions 41 and 42) are removed through development, and optionally, light exposure and thermal curing are carried out, to thereby produce a mounting board 10 including a first insulating layer 4 (formed of the non-developable portions 41 and 42) and a second insulating layer 5 (formed of the non-developable portion 51) (FIG. 3H).

In the mounting board 10, the mounting pads 2 are exposed through the openings 4a provided in the first insulating layer 4 formed of the non-developable portion 41, and the mounting region A is present within the opening 5a of the second insulating layer 5 formed of the non-developable portion 51 stacked on the non-developable portion 42. The mounting pads 3 are exposed through the openings 6a of the laminate 6 including the first insulating layer 4 formed of the non-developable portion 42 and the second insulating layer 5 formed of the non-developable portion 51.

The production method for the mounting board 10 is not limited to that described above, and the board may be produced through a variety of methods. For example, according to the aforementioned process, in the light exposure step of forming the non-developable portion 41, only the first region S1 in which only the first insulating layer is to be provided is exposed to light. However, in order to secure positioning of the first region S1 and the second region S2, a non-developable portion corresponding to both the first region S1 and a portion of the second region S2 may be formed in the first solder resist 40, or a non-developable portion corresponding to both the first region S1 and the second region S2 may be formed in the first solder resist 40.

FIGS. 5A to 5H show a process in which a non-developable portion corresponding to both a first region S1 and a portion of a second region S2 is formed in a first solder resist 40. The same components as shown in FIGS. 3A to 3H are denoted by the same reference numerals, and repeated description is omitted.

Figure 5A:
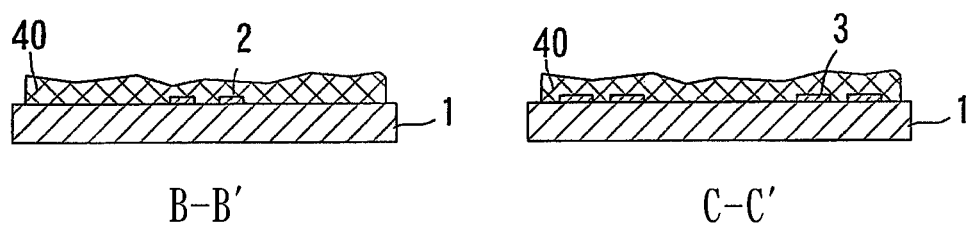
FIGS. 5A to 5H are cross-sectional sketches showing a method for producing the solder-mounted board according to another embodiment.
Figure 5B:
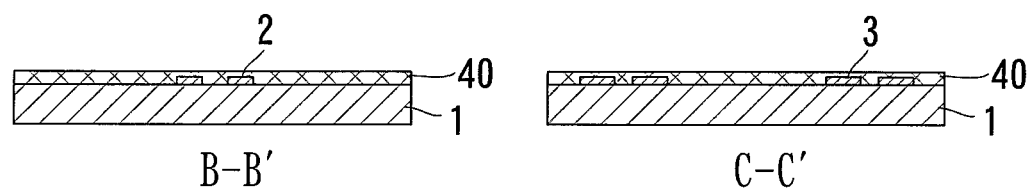
Figure 5C:
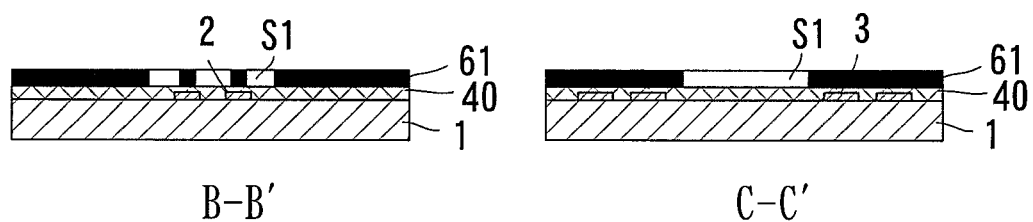
Figure 5D:
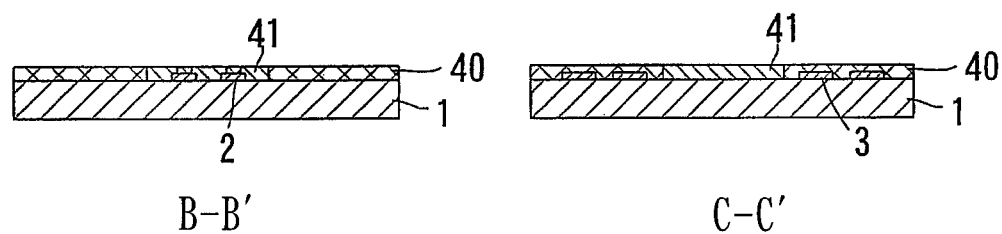
Figure 5E:
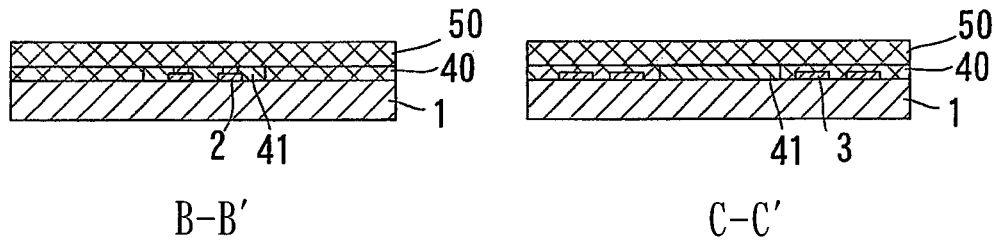
Figure 5F:
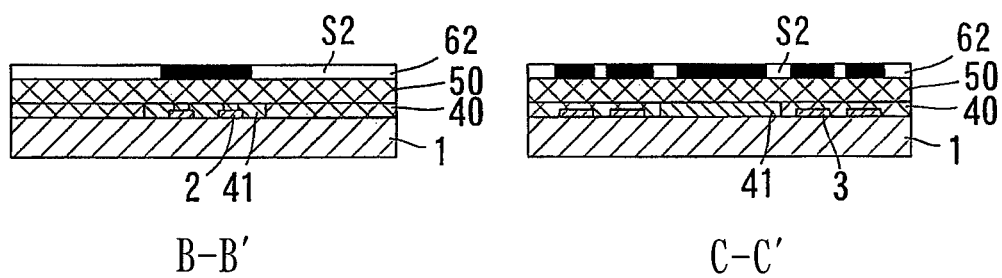
Figure 5G:
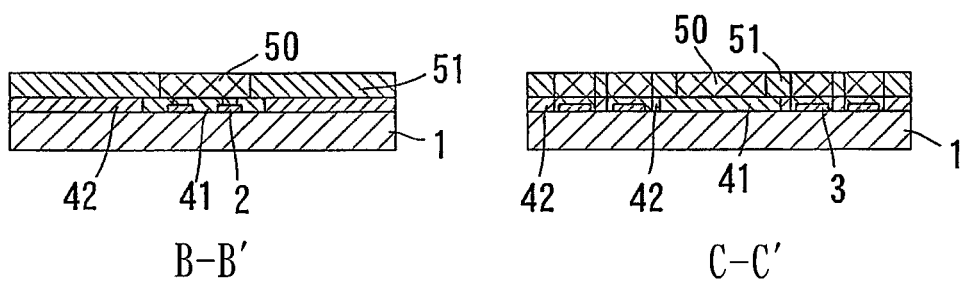
Figure 5H:
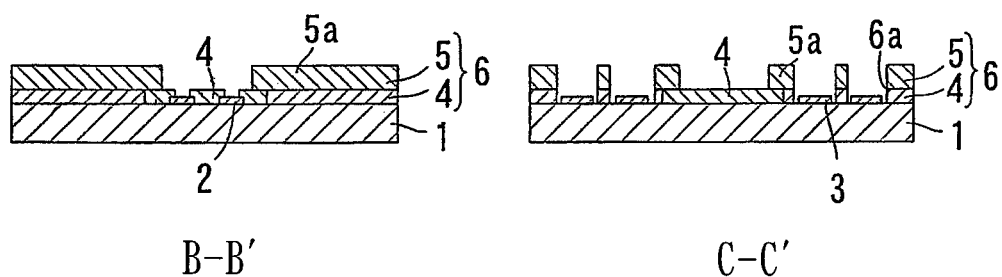
Figure 6A:
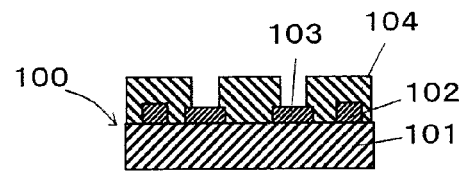
FIGS. 6A to 6H are cross-sectional sketches showing a mounting process employing a conventional mounting board.
Figure 6B:
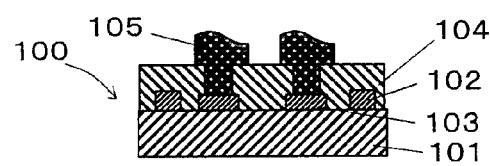
Figure 6C:
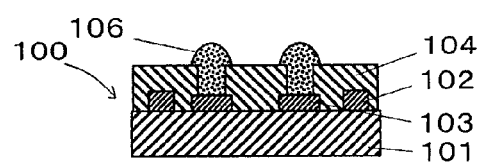
Figure 6D:
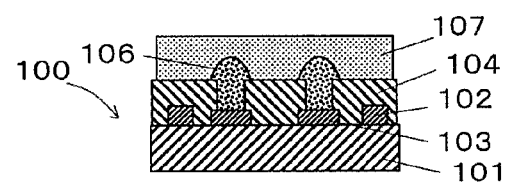
Figure 6E:
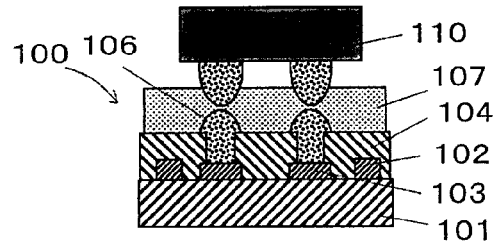
Figure 6F:
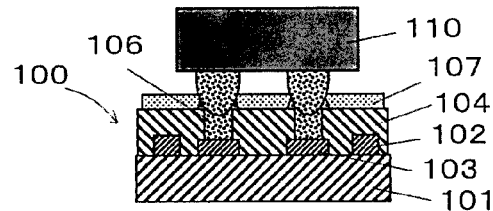
Figure 6G:
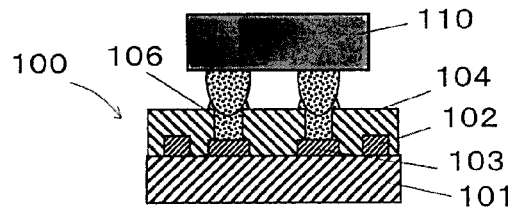
Figure 6H:
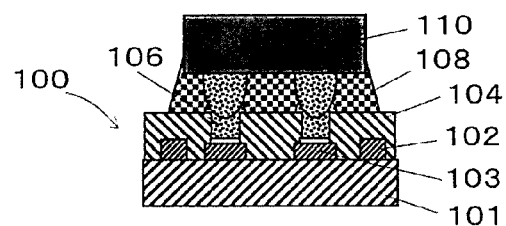
Figure 7A:
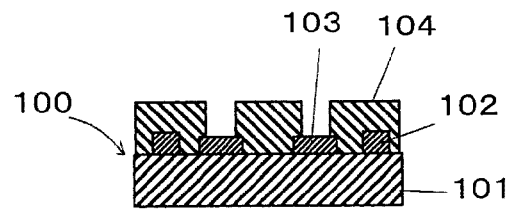
FIGS. 7A to 7F are cross-sectional sketches showing another mounting process employing a conventional mounting board.
Figure 7B:
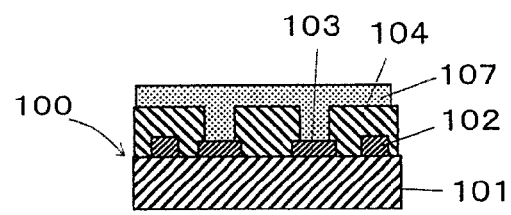
Figure 7C:
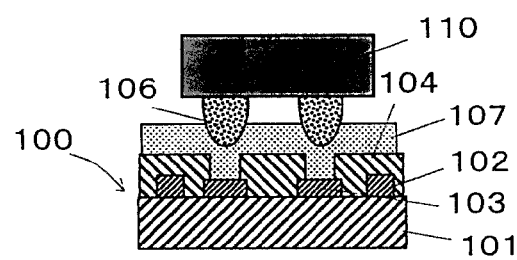
Figure 7D:
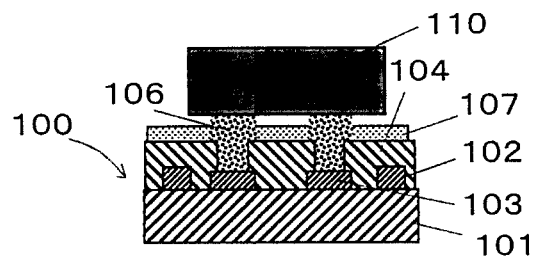
Figure 7E:
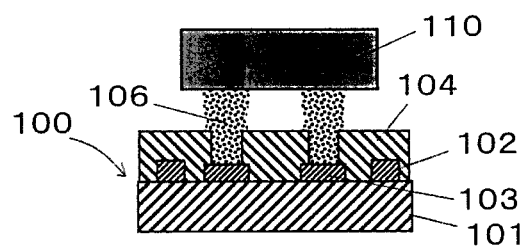
Figure 7F:
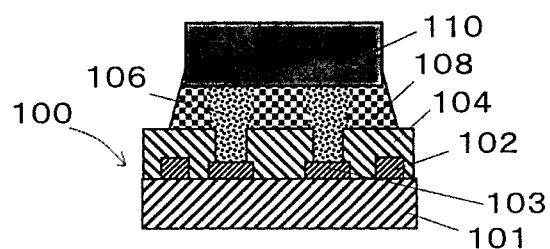
Figure 8A:
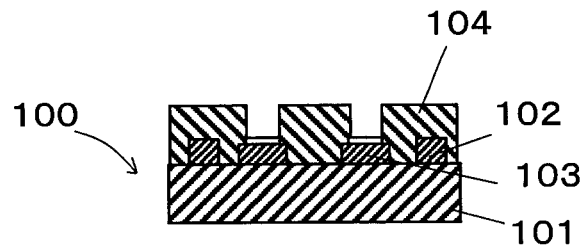
FIGS. 8A to 8E are cross-sectional sketches showing yet another mounting process employing a conventional mounting board.
Figure 8B:
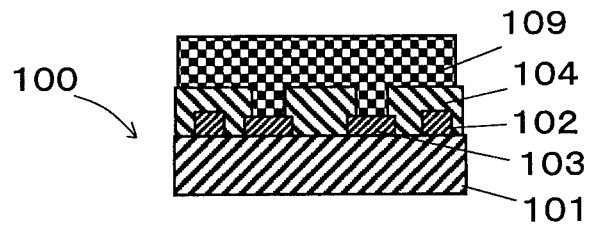
Figure 8C:
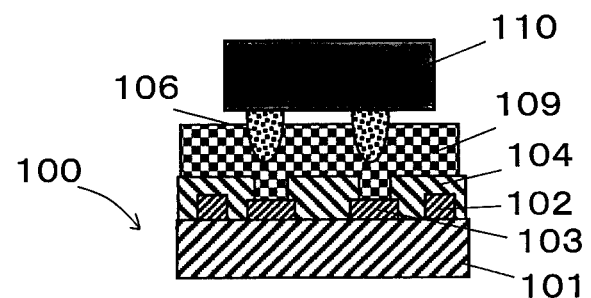
Figure 8D:
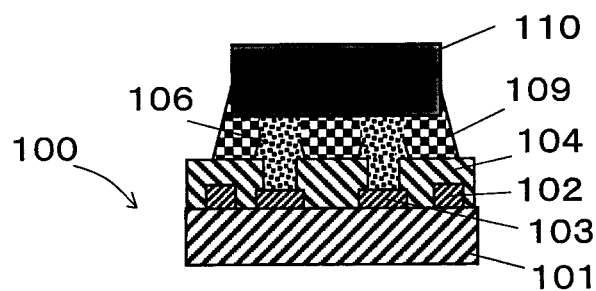
Figure 8E:
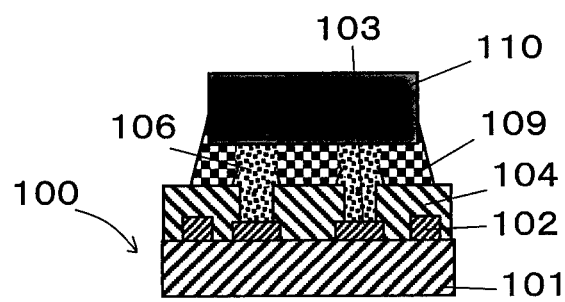

As shown in FIG. 5A, in this process for producing a mounting board, a circuit including mounting pads 2 and 3 is formed on a plastic substrate 1 through patterning, and then a first solder resist 40 (negative-type photosensitive solder resist) is applied to the substrate 1. Subsequently, drying and planarization treatment are carried out (FIG. 5B). Then, a first region S1 in which only a first insulating layer is to be provided is exposed to light via a mask 61, and also a portion of the boundaries of a second region S2 with the first region S1 in which both the first insulating layer and a second insulating layer are to be provided is exposed to light via the mask 61 (FIG. 5C), to thereby form a non-developable portion 41 (corresponding to both the first region S1 and a portion of the second region S2; i.e., light exposure region) in the first solder resist 40 (FIG. 5D). Next, a second solder resist 50 (negative-type photosensitive solder resist) is applied to the first solder resist 40, followed by drying (FIG. 5E). Then, the second region S2 in which both the first insulating layer and the second insulating layer are to be provided is exposed to light via a mask 62 (FIG. 5F), to thereby form a non-developable portion 51 of the second solder resist 50 and a non-developable portion 42 of the first solder resist 40 (FIG. 5G). In this case, the non-developable portion 41, which has been formed through the above light exposure, is present below a portion of the non-developable portion 51. Finally, the second solder resist 50 (exclusive of the non-developable portion 51) and the first solder resist 40 (exclusive of the non-developable portions 41 and 42) are removed through development, and optionally, light exposure and thermal curing are carried out, to thereby produce a mounting board 10 including a first insulating layer 4 (formed of the non-developable portions 41 and 42) and a second insulating layer 5 (formed of the non-developable portion 51) (FIG. 5H).

In the mounting board 10, the mounting pads 2 are exposed through the openings 4a provided in the first insulating layer 4 formed of the non-developable portion 41, and the mounting region A is present within the opening 5a of the second insulating layer 5 formed of the non-developable portion 51 stacked on the non-developable portion 42. The mounting pads 3 are exposed through the openings 6a of the laminate 6 including the first insulating layer 4 formed of the non-developable portion 42 and the second insulating layer 5 formed of the non-developable portion 51.

What is claimed is:
1. A solder-mounted board comprising:
   a substrate;
   a wiring layer;
   a solder pad for mounting a component by mediation of solder;
   an insulating layer which covers the wiring layer such that at least the solder pad is exposed,
   the wiring layer, the solder pad, and the insulating layer being provided on at least one surface of the substrate,
   wherein the insulating layer is formed of a first insulating layer provided on the substrate and the wiring layer, and a second insulating layer provided on at least a portion of the first insulating layer;
   an opening provided in the second insulating layer such that a component mounting region falls within the opening in the second insulating layer, the opening in the second insulating layer having an outer perimeter,
   wherein in the opening in the second insulating layer there is present a portion of the first insulating layer such that an upper surface of the portion of the first insulating layer is located inside the outer perimeter of the opening in the second insulating layer;
   openings provided in the portion of the first insulating layer present in the opening in the second insulating layer, wherein the component mounting region includes a plurality of solder pad portions exposed through the openings provided in the first insulating layer such that in the opening in the second insulating layer, the solder pad portions are exposed through the openings in the portion of the first insulating layer, each solder pad portion defining a mounting pad.

2. A solder-mounted board according to claim 1, wherein the first insulating layer and the second insulating layer are stacked together at the outer perimeter of the opening in the second insulating layer, and the upper surface of the first insulating layer is present inside and along the outer perimeter of the opening of the second insulating layer.

3. A solder-mounted board according to claim 2, wherein at least some of the solder pad portions exposed through the openings provided in the portion of the first insulating layer are located where the the first insulating layer and the second insulating layer are stacked together.

4. A solder-mounted board according to claim 1, wherein at least one of the solder pad portions is exposed through a corresponding one of the openings provided in a portion of the insulating layer at which the first insulating layer and the second insulating layer are stacked together.

5. A solder-mounted board according to claim 1, wherein the first insulating layer is formed of a photocurable solder resist.

6. A solder-mounted board according to claim 1, wherein the second insulating layer is formed of a photocurable solder resist.

7. A semiconductor device comprising a solder-mounted board as recited in claim 1, and a component mounted on the board by the mediation of the solder.

8. A solder-mounted board according to claim 1, wherein the first insulating layer is formed of a thermosetting solder resist.

9. A solder-mounted board according to claim 1, wherein the second insulating layer is formed of a thermosetting solder resist.

* * * * *